United States Patent
Wu et al.

(10) Patent No.: US 7,943,494 B2
(45) Date of Patent: May 17, 2011

(54) METHOD FOR BLOCKING DISLOCATION PROPAGATION OF SEMICONDUCTOR

(75) Inventors: Peng Yi Wu, Taichung (TW); Shih Cheng Huang, Hsinchu (TW); Po Min Tu, Chiayi County (TW); Ying Chao Yeh, Taipei County (TW); Wen Yu Lin, Taichung County (TW); Shih Hsiung Chan, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 31 days.

(21) Appl. No.: 12/579,779

(22) Filed: Oct. 15, 2009

(65) Prior Publication Data

US 2010/0099213 A1     Apr. 22, 2010

(30) Foreign Application Priority Data

Oct. 16, 2008   (TW) .............................. 97139665 A

(51) Int. Cl.
 *H01L 21/00* (2006.01)
 *H01L 21/66* (2006.01)
 *H01L 21/20* (2006.01)
 *H01L 21/36* (2006.01)

(52) U.S. Cl. ............. 438/481; 438/29; 438/46; 438/82; 438/478; 438/483; 257/E21.125; 257/E21.158; 257/E21.318

(58) Field of Classification Search ........... 257/E21.125, 257/E21.158, E21.318
See application file for complete search history.

(56) References Cited

U.S. PATENT DOCUMENTS

| | | | |
|---|---|---|---|
| 2004/0067648 A1 | 4/2004 | Morita et al. | |
| 2006/0035447 A1* | 2/2006 | Ikeda et al. | 438/493 |
| 2009/0294860 A1* | 12/2009 | Mowry et al. | 257/368 |

FOREIGN PATENT DOCUMENTS

| TW | 561632 | * 11/2003 |
|---|---|---|
| TW | 242898 | * 11/2005 |

OTHER PUBLICATIONS

Bell et al. Light Emission and Microstructure of Mg-doped AlGaN grown on Patterned sapphire, Jan. 20, 2003, Applied Physics Letters, vol. 82, No. 3.*

Shuji et al. InGaN/GaN/AlGaN-based laser diodes with modulation-doped strained-layer superlattices grown on an epitaxially laterally overgrown GaN substrate, Jan. 12, 1998, AppLied Physics Letter. 72 (2).*

* cited by examiner

*Primary Examiner* — Charles Garber
*Assistant Examiner* — Mohsen Ahmadi
(74) *Attorney, Agent, or Firm* — Raymond J. Chew

(57) ABSTRACT

The present invention provides a method for blocking the dislocation propagation of a semiconductor. A semiconductor layer is formed by epitaxial process on a substrate. A plurality of recesses is formed on the semiconductor layer by etching fragile locations of the semiconductor layer where dislocation occurs. Thereafter, a blocking layer is formed on each of the plurality of recesses. The aforesaid semiconductor layer undergoes epitaxial process again on the aforesaid semiconductor layer, and laterally overgrows to redirect the dislocation defects.

18 Claims, 4 Drawing Sheets

METHOD FOR BLOCKING DISLOCATION PROPAGATION OF SEMICONDUCTOR

BACKGROUND OF THE INVENTION

1. Field of the Invention

The present invention relates to a method for blocking the dislocation propagation of a semiconductor.

2. Description of the Related Art

Currently, common solid state semiconductor devices comprise light emitting diodes (LED), laser diodes, and semiconductor RF (radio frequency) devices. Generally, the light emitting diode, the laser diode, or the semiconductor RF device includes a semiconductor device such as an RF device and a light emitting device with a p-n junction formed on the epitaxial substrate.

The structure of a blue or red light emitting diode comprises a sapphire substrate, a buffer layer formed on the sapphire substrate, an N-type GaN semiconductor layer, an active layer partly covering the N-type GaN semiconductor layer, a P-type GaN semiconductor layer formed on the active layer, and two contact electrodes respectively formed on the aforesaid two semiconductor layers.

The luminous efficiency of LEDs is affected by some factors such as internal quantum efficiency and external quantum efficiency. The major factor affecting the internal quantum efficiency is the amount of dislocation existing in the active layer. However, lattice mismatch always occurs in the materials of a sapphire substrate and a GaN layer. Therefore, the threading dislocation also occurs during the epitaxial process.

FIG. 1A is a schematic diagram of a prior art disclosed by Taiwanese patent publication No. TW561632. The device comprises a sapphire substrate 10, an N-type semiconductor layer 11 formed on the sapphire substrate 10, an active layer 12 capable of generating light with default wavelengths formed on the N-type semiconductor layer 11, and a P-type semiconductor layer 13 formed on the active layer 12.

A plurality of recesses 14 are periodically arranged and formed on the sapphire substrate 10 using photolithography equipment and a reactive ion etching process. Therefore, the N-type semiconductor layer 11 on the sapphire substrate 10 without crystal defects is filled in each of the recesses 14. The depth and width of each of the recesses 14 are respectively 1 μm and 10 μm. The pitch, defined as the distance between the centers of two adjacent recesses, is 10 μm.

A. Bell, R. Liu, F. A. Ponce, H. Amano, I. Akasaki, D. Cherns, et al. propose a GaAlN doped with Mg grown on a patterned sapphire substrate in Applied Physics Letters, vol. 82, No. 3, pp. 349-351 and discuss its luminous characteristics and microstructure. This paper puts forth that a sapphire substrate patterned with a plurality of grooves is formed by performing photolithography and reactive ion etching processes, and an epitaxial layer of GaAlN doped with Mg is formed on the patterned sapphire substrate. A great deal of threading dislocation exists in the epitaxial layer, and the epitaxial lateral overgrowth (ELOG) regions of the epitaxial layer above each of the stripe-shaped grooves have no defects.

In addition, Shulij Nakamura, Masayuki Senoh, Shinichi Nagahama, Naruhito Iwasa, Takao Tamada, et al., researchers of Nichia Chemical Co., propose a laser diode of modulation-doped strained-layer superlattices formed on an epitaxial lateral overgrowth GaN substrate in Appl. Phys. Lett. 72(2), 211-213. Referring to FIG. 1B, a buffer layer 91 and a GaN layer with a thickness of 2 μm are sequentially formed on a sapphire substrate 90. A silica layer 93 with a thickness of 0.1 μm is further formed on the GaN layer 92, and the silica layer 93 has stripe-shaped windows 94 with a width of 4 μm by a photolithography process. The windows 94 of the silica layer 93 act as a mask (silica mask) on the GaN layer 92. Finally, an N-type GaN layer 95 is sequentially formed on the mask by a two jet-flow MOCVD method so that a sequential device can be formed thereon.

The researchers of Nichia utilize an amorphous mask to direct epitaxial vertical overgrowth layers in the windows 94 to be laterally merged with each other so as to form epitaxial lateral overgrowth layers on the mask. Accordingly, the dislocation density of the epitaxial layer is reduced.

Although the aforesaid prior patents and techniques can reduce the threading dislocation occurring in an epitaxial layer during an epitaxial process, all of the aforesaid recesses and windows are regularly arranged, so the dislocation defects cannot be completely eliminated.

Finding a means to reduce the dislocation density of an epitaxial layer during an epitaxial process and improving the luminous characteristics of the epitaxial layer are still critical issues for the manufacturers currently investing significant resources on research in the epitaxial field.

SUMMARY OF THE INVENTION

In view of the above descriptions, the present invention provides a method for blocking the dislocation propagation of a semiconductor to achieve the objectives that the aforesaid methods for blocking the dislocation propagation of a semiconductor cannot achieve.

The present invention provides a method for blocking the dislocation propagation of a semiconductor. A semiconductor layer is formed by epitaxial process on a substrate. Recesses are formed on the semiconductor layer by etching fragile locations of the semiconductor layer where dislocation occurs. Thereafter, a blocking layer is formed on each of the recesses. The aforesaid semiconductor layer undergoes epitaxial process again on the aforesaid substrate, and laterally overgrows to redirect the dislocation defects.

The present invention further provides a method for blocking the dislocation propagation of a semiconductor. First, the aforesaid steps are performed at least one time. Thereafter, a compound semiconductor multilayer is formed by epitaxial process on the latter semiconductor layer to form an LED. The compound semiconductor multilayer comprises an N-type semiconductor conductive layer, a P-type semiconductor conductive layer, and an active layer, wherein the active layer is between the N-type semiconductor conductive layer and the P-type semiconductor conductive layer.

BRIEF DESCRIPTION OF THE DRAWINGS

The invention will be described according to the appended drawings in which.

DETAILED DESCRIPTION OF THE INVENTION

Figure 1A:
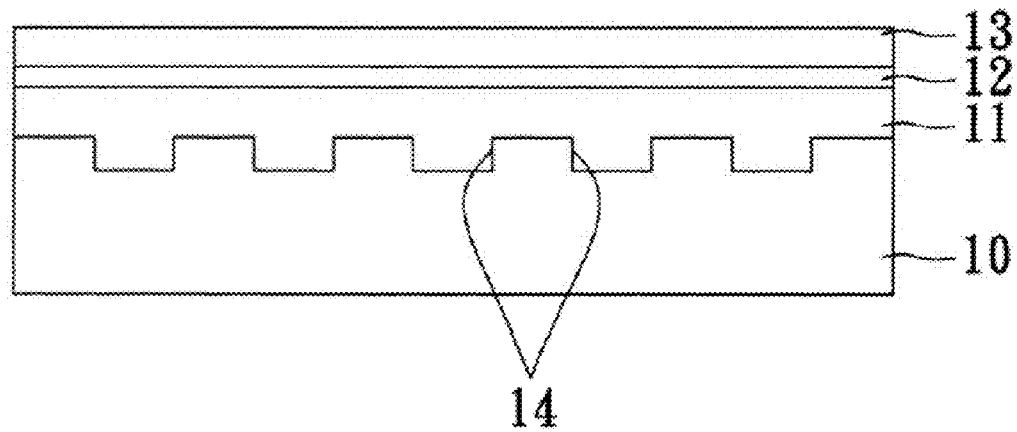
FIGS. 1A and 1B are schematic structure diagrams of a prior art.
Figure 1B:
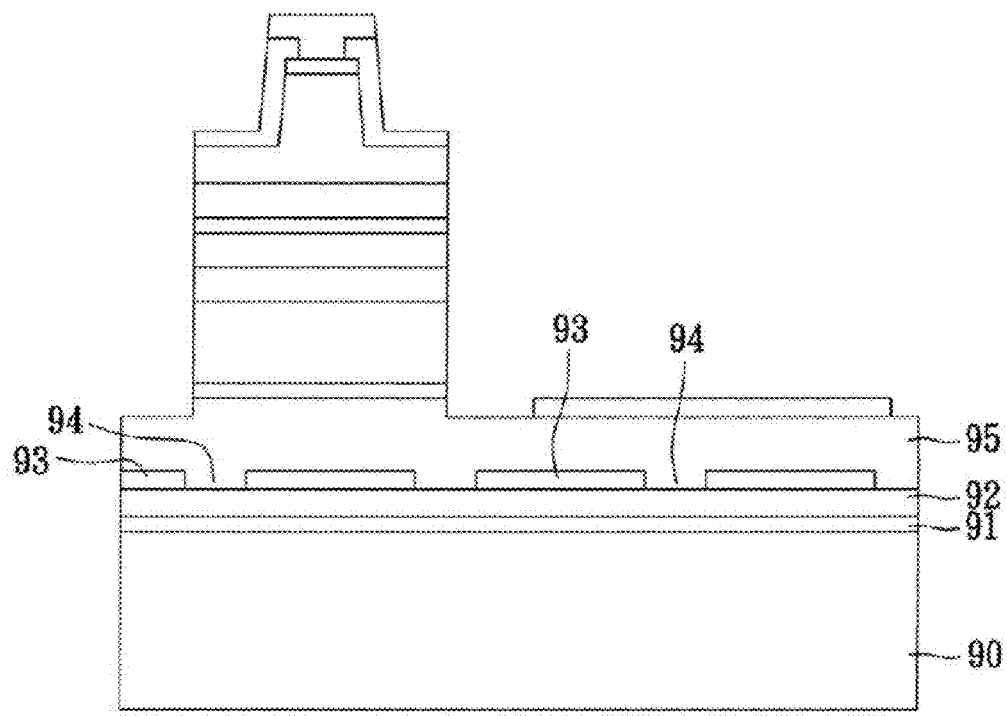

The present invention is related to a method for blocking the dislocation propagation of a semiconductor. For the purpose of understanding the present invention thoroughly, the descriptions below illustrate detailed steps and the compositions thereof. Clearly, the embodiment of the present invention is not limited to the particular method or the system familiar to those skilled in the art of blocking the dislocation propagation of a semiconductor. On the other hand, the ordinary skills in the art are not illustrated to avoid unnecessary limitations on the present invention. The preferred embodiments are illustrated below but the present invention may be utilized in other practices and should not be limited by such illustrated embodiments. The scope of the present invention should be interpreted in light of the claims.

Many papers have been proposed attempting to reduce the density of dislocation defects, but none of them can block dislocation defects. For example, U.S. Pat. No. 6,252,261 overlays a silica ($SiO_2$) layer on a group III nitride semiconductor layer to act as masks regularly arranged. However, the dislocation defects cannot be completely blocked.

U.S. Pat. No. 6,861,270 interposes a silicon nitride layer between N-type and P-type group III nitride semiconductor layers by depositing so as to enable the spatial fluctuation of band-gap in an active layer. However, the defective density of the internal material cannot be reduced.

Furthermore, U.S. Pat. No. 6,462,357 forms island crystals by using group II nitride material ([Be, Mg, Ca, Sr, Ba, Zn, Cd, Hg]N) on a substrate or a group III nitride semiconductor layer. Because the adjustable parameters for epitaxial growth are limited, the optimal result is not easily obtained.

U.S. Pat. No. 6,627,974 utilizes an additional CVD process to form a protective film ($SiO_x$, $Si_xN_y$, $TiO_x$, or $ZrO_x$) which is regularly arranged. However, the dislocation defects cannot be completely blocked.

U.S. Pat. No. 6,345,063 utilizes silica or silicon nitride as a patterned mask layer having a regular layout. However, the dislocation defects cannot be completely blocked. In this patent, InGaN is directly grown on the patterned mask layer. Therefore, an epitaxial layer of high quality is not easily formed thereon.

TW patent No. 1242898 puts forth a method blocking the propagation of line dislocation occurring only in hexagon vias. As to line dislocation around the hexagon vias, a TEM (Transmission Electron Microscopy) picture cannot show any redirection effects on the dislocation because of lateral growth.

In contrast, the present invention provides a method for blocking the dislocation propagation of a semiconductor. Before dislocation defects go to an active layer, an epitaxial blocking layer with orientation is used to block the extension, in contrast to the epitaxial blocking layers without orientation as seen in the prior arts. Furthermore, the line dislocation is likely to be blocked because of lateral growth mechanism. First, a semiconductor layer is formed by epitaxial process on a substrate. Recesses are formed on the semiconductor layer by etching fragile locations of the semiconductor layer where dislocation occurs. The aforesaid plurality of recesses can be formed by etching the semiconductor layer. When the semiconductor layer is etched, the fragile locations of the semiconductor layer resulted from the dislocation defects are etched to be recesses by etchant.

Thereafter, a blocking layer is formed on each of the recesses. The steps of forming the blocking layer on a plurality of recesses comprise: depositing a blocking layer on the semiconductor layer; coating photoresist on the blocking layer to fill in the plurality of recesses; removing the photoresist outside the plurality of recesses; removing the blocking layer outside the plurality of recesses by etching and leaving the blocking layer existing in the plurality of recesses; and removing the photoresist remaining on the plural areas of the blocking layer to expose the blocking layer existing in the recesses.

The same semiconductor layer undergoes epitaxial process again on the aforesaid semiconductor layer, and laterally grows to redirect the dislocation defects. The present invention further provides a method for blocking the dislocation propagation of a semiconductor. First, the aforesaid steps are performed at least one time. Thereafter, a compound semiconductor multilayer is formed by epitaxial process on the latter semiconductor layer to form an LED. The compound semiconductor multilayer comprises an N-type semiconductor conductive layer, a P-type semiconductor conductive layer, and an active layer, wherein the active layer is between the N-type semiconductor conductive layer and the P-type semiconductor conductive layer.

The material of the aforesaid substrate is sapphire ($Al_2O_3$), silicon carbide (SiC), $AlLiO_2$, $LiGaO_2$, silicon (Si), gallium nitride (GaN), zinc oxide (ZnO), aluminum zinc oxide (AlZnO), gallium arsenide (GaAs), gallium phosphide (GaP), gallium antimonide (GaSb), indium phosphide (InP), indium arsenide (InAs), zinc selenide (ZnSe), or other metal. The present invention further comprises a buffer layer interposed between the aforesaid substrate and the compound semiconductor multilayer. The present invention also comprises a P-type semiconductor electron barrier layer interposed between the active layer and the P-type semiconductor conductive layer.

The aforesaid embodiments are particularized by diagrams and flow charts to show the structures and formation steps of the present invention.

Figure 2:
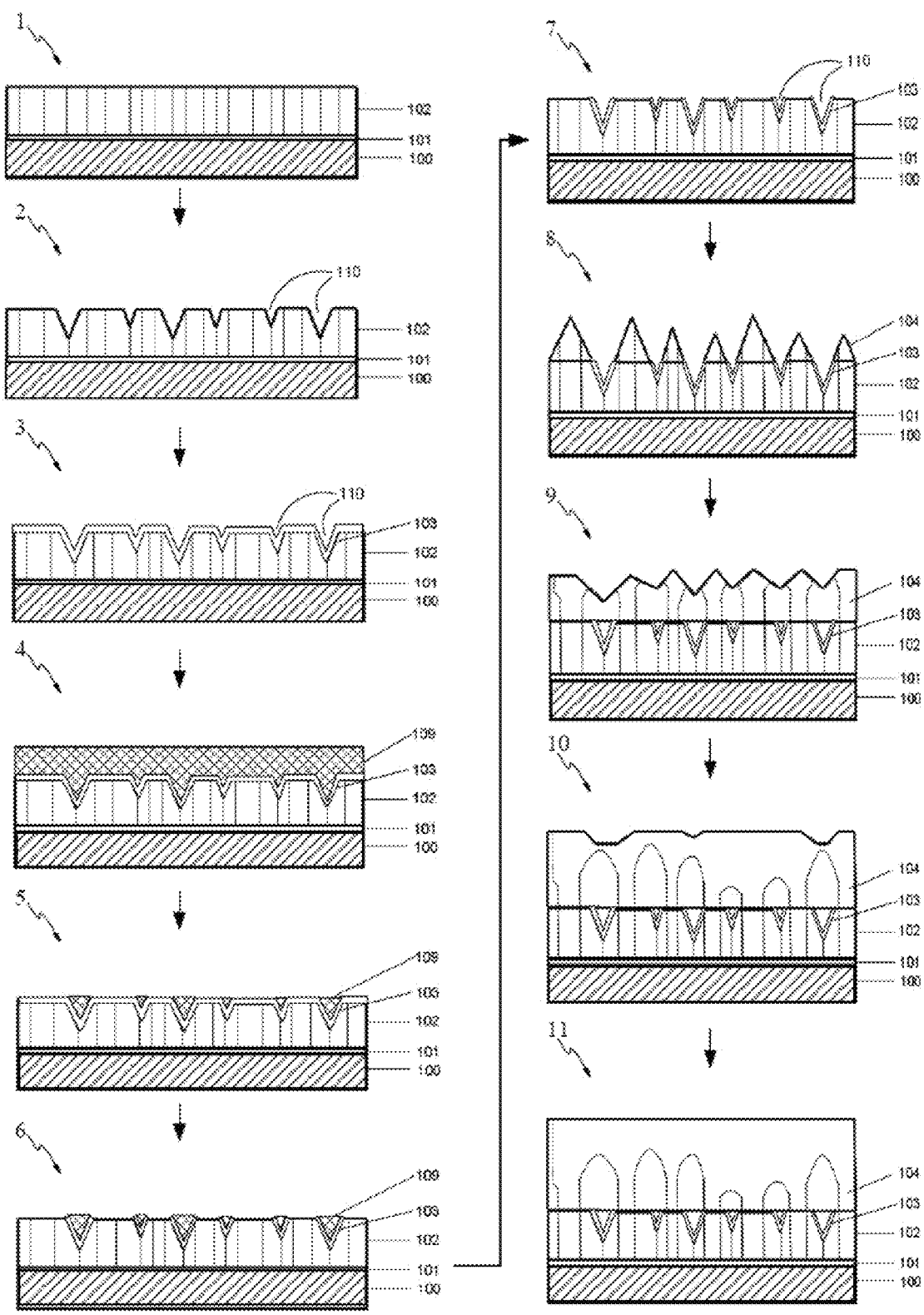
FIG. 2 is a flow chart of manufacturing processes for blocking dislocation propagating in a semiconductor layer in accordance with the present invention.

FIG. 2 is a flow chart of manufacturing processes for blocking dislocation propagating in a semiconductor layer. First, as shown in Step 1, a substrate 100 is provided. A semiconductor layer 102 is formed on the substrate 100. The material of the substrate 100 is sapphire ($Al_2O_3$), silicon carbide (SiC), $AlLiO_2$, $LiGaO_2$, silicon (Si), gallium nitride (GaN), zinc oxide (ZnO), aluminum zinc oxide (AlZnO), gallium arsenide (GaAs), gallium phosphide (GaP), gallium antimonide (GaSb), indium phosphide (InP), indium arsenide (InAs), or zinc selenide (ZnSe). The choice of material of the substrate is dependent on the sequential epitaxial material deposited on it. For example, II-VI semiconductor compound is commonly and preferably formed on a zinc selenide substrate or a zinc oxide substrate as an epitaxial base. Group III arsenide or Group III phosphide is commonly formed on a gallium arsenide substrate, a gallium phosphide substrate, an indium phosphide substrate, or an indium arsenide substrate. In the current LED market, Group III nitride is commonly formed on a sapphire substrate, or a silicon carbide substrate, and an $AlLiO_2$ substrate, a $LiGaO_2$ substrate, a silicon substrate, or an aluminum zinc oxide substrate is also used in an experimental stage. Furthermore, the structure and coefficient of crystal lattice are another consideration for selecting the epitaxial substrate. When the coefficients of crystal lattice of two layers are significantly different from each other, a buffer layer needs to be first formed on the lower layer to obtain a good quality upper epitaxial layer. In this embodiment, when the epitaxial material is Group III nitride, particularly gallium nitride, the common epitaxial substrate is a sapphire substrate or a silicon carbide substrate which is used in the current LED market. However, a person skilled in the art can understand the epitaxial material is not limited to the Group III nitride or even the gallium nitride. Any III-VI semiconductor compound or II-V semiconductor compound can be applied to the present invention.

When sapphire or silicon carbide is used to as the substrate, a buffer layer 101 is formed on the substrate prior to the formation of Group III nitride because the mismatch of the crystal lattice between the sapphire substrate and gallium nitride is as high as 14%. The mismatch of the crystal lattice between the silicon carbide substrate and gallium nitride is also as high as 3.5%. Generally, the material of the buffer layer 101 can be gallium nitride, aluminum gallium nitride (AlGaN), aluminum nitride (AlN), or a superlattice structure of InGaN/InGaN. As to the superlattice structure of InGaN/InGaN, TW Patent Application No. 096104378 filed by Advanced Optoelectronic Technology Inc. introduces the detailed technology. The buffer layer 101 is deposited in epitaxial equipment such as MOCVD (metal organic chemical vapor deposition) equipment or MBE (molecular beam epitaxy) equipment under a temperature lower than the temperatures of forming sequential epitaxial layers. For example, AlGaInN undergoes epitaxial process between 800-1,400° C., and the buffer layer undergoes epitaxial process between 250-700° C. When the MOCVD equipment is used, the precursor of nitrogen can be $NH_3$ or $N_2$, the precursor of gallium can be trimethylgallium or Triethylgallium, the precursor of aluminum can be trimethylaluminum or Triethylaluminum, and the reaction chamber can be set to low pressure or normal pressure.

Thereafter, as shown in Step 2, a plurality of recesses 110 is formed by etching the fragile locations of the semiconductor layer 102 where dislocation occurs. A blocking layer 103 is formed on the semiconductor layer 102, as shown in Step 3. A photoresist is coated on the blocking layer 103 to form a photoresist layer 109 filling in the plurality of recesses 110, as shown in Step 4. As shown in Step 5, the photoresist layer 109 outside the plurality of recesses 110 is removed and the photoresist layer 109 inside the plurality of recesses 110 is left in place. As shown in Step 6, the blocking layer 103 outside the plurality of recesses 110 is removed and the blocking layer 103 existing in the plurality of recesses 110 is also left in place. The photoresist layer 109 remaining in the plurality of recesses 110 is removed by a photolithography process, as shown in Step 7. The material of the blocking layer 103 can be dielectric comprising magnesium nitride ($Mg_xN_y$), silicon nitride ($Si_xN_y$), silicon oxide ($Si_xO_y$), titanium oxide ($Ti_xO_y$), zirconium oxide ($Zr_xO_y$), hafnium oxide ($Hf_xO_y$), tantalum oxide ($Ta_xO_y$), silicon nitride (SiN), and silicon oxide (SiO).

Referring to Step 8, a re-epitaxial semiconductor layer 104 is formed by epitaxial process on the semiconductor layer 102. The aforesaid blocking layer 103 can block the growth of the semiconductor layer 104, and hence, the semiconductor layer 104 laterally overgrows toward the plurality of recesses 110. Accordingly, the dislocation is redirected so the defects of the dislocation are stopped in the re-epitaxial semiconductor layer 104, as shown in Steps 9, 10, and 11.

Figure 3:
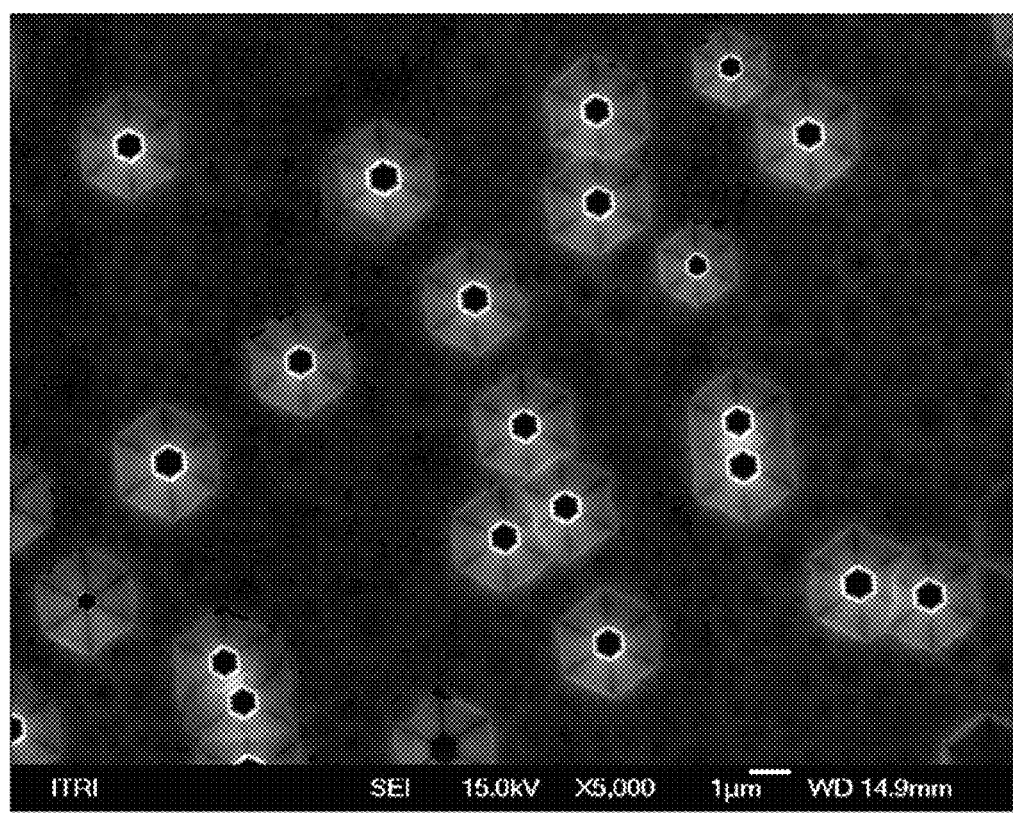
FIG. 3 is an SEM picture showing recesses on the semiconductor in accordance with the present invention.

FIG. 3 is an SEM (scanning electron microscope) picture showing recesses on the semiconductor layer in accordance with the present invention.

Figure 4:
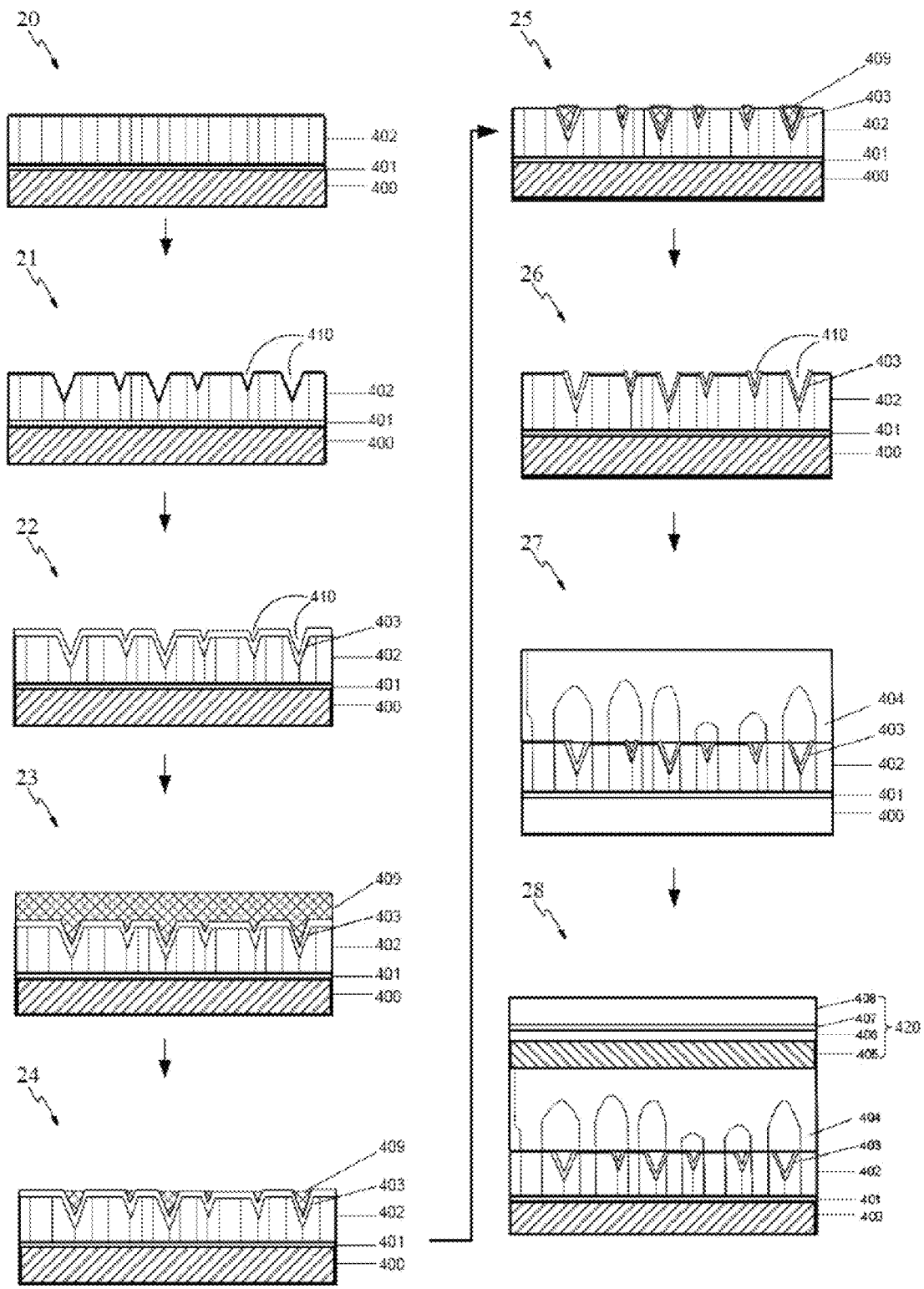
FIG. 4 is a flow chart of manufacturing processes for blocking dislocation propagating in a semiconductor in accordance with another embodiment of the present invention.

The present invention applies the aforesaid method for blocking the dislocation propagation of a semiconductor to the LED fabrication so as to have a method for restraining dislocation defects inside LEDs. Referring to FIG. 4, this method performs at least one cycle of the aforesaid method for blocking the dislocation propagation of a semiconductor, and a re-epitaxial semiconductor layer 404. Thereafter, a compound semiconductor multilayer 420 is formed on the re-epitaxial semiconductor layer 404 to obtain an LED. Therefore, the density of dislocation defects inside the LED can be dramatically reduced by implementing the aforesaid method. The defects of the material are effectively restrained to improve the lighting characteristics and the electrical characteristics of light emitting devices.

First, by implementing the aforesaid steps, the dislocation defects of the re-epitaxial semiconductor layer 404 can be restrained. As shown in Step 20, a buffer layer 401 is formed on a substrate 400, and a semiconductor layer 402 is formed on the buffer layer 401. As shown in Step 21, a plurality of recesses 410 is formed on the semiconductor layer 402 by etching the semiconductor layer 402 where dislocation occurs. Thereafter, as shown in Step 22, a blocking layer 403 is formed on the semiconductor layer 402. As shown in Step 23, photoresist is coated on the blocking layer 403 as a photoresist layer 409 to fill in the plurality of recesses 410. Thereafter, as shown in Step 24, the photoresist layer 409 outside the plurality of recesses 410 is removed. As shown in Step 25, the photoresist layer 409 outside the plurality of recesses 410 is etched, and the photoresist layer 409 is left as a plurality of areas in the recesses 410. As shown in Step 26, the remaining photoresist layer 409 is removed by a photolithography process. As shown in Step 27, the same semiconductor layer 402 undergoes epitaxial process again on the aforesaid semiconductor layer 402, and laterally grows to form as a re-epitaxial semiconductor layer 404 for redirecting the dislocation defects.

As shown in Step 27, the dislocation defects cannot be completely restrained in the re-epitaxial semiconductor layer 404. Therefore, the aforesaid steps are performed again to further block the other dislocation, whereby the density of dislocation defects inside the device can be dramatically reduced.

Finally, as shown in Step 28, a compound semiconductor multilayer 420 is formed by epitaxial process on the re-epitaxial semiconductor layer 404 to form an LED. The compound semiconductor multilayer 420 comprises an N-type semiconductor conductive layer 405, an active layer 406, and a P-type semiconductor conductive layer 408. Furthermore, the aforesaid LED further comprises a P-type semiconductor electron barrier 407 between the active layer 406 and the P-type semiconductor conductive layer 408 so as to improve the light extraction efficiency of the LED. In a preferred embodiment of the present invention, the N-type semiconductor conductive layer 405, the active layer 406, the P-type semiconductor electron barrier layer 407, and the P-type semiconductor conductive layer 408 can all be group III nitride.

The N-type semiconductor conductive layer 405 can be a layer of gallium nitride or aluminum gallium nitride acting as a cladding layer of the N-type conduction of the LED. The N-type conduction of gallium nitride or aluminum gallium nitride is formed in MOCVD equipment or MBE equipment. During the formation of the nitride layer, group IV atoms are simultaneously doped. In this embodiment, the group IV atoms are silicon atoms. The precursor of silicon is silane or disilane suitable for the MOCVD equipment. Under the cladding layer, a gallium nitride layer (not shown) without dopant and a contact layer (not shown) of the N-type conduction can be previously and sequentially formed on the buffer layer, and the formation steps of the two layers are optional for this embodiment. The gallium nitride layer without dopant can improve the epitaxial quality of the cladding layer of the N-type conduction. The material of the contact layer of the N-type conduction can be highly-doped gallium nitride or highly-doped aluminum gallium nitride to have a superior conductive effect with the N-type electrodes.

The aforesaid active layer 406 can be a single heterostructure structure, a double heterostructure structure, a single quantum well structure, or a structure of multi quantum well layers/barrier layers. The material of the quantum well layer can be indium gallium nitride, and the material of the barrier can be a ternary component structure such as aluminum gallium nitride. Furthermore, a quaternary component structure can also be selected. That is, $Al_xIn_yGa_{1-x-y}N$ can be used as the quantum well layer and the barrier layer, wherein the proportion of aluminum and indium can be adjusted to obtain the barrier layer with high energy band gap and the quantum well layer with lower energy band gap. The formation of the active layer is similar that of the aforesaid cladding layer of N-type conduction. The precursor of indium can be trimethyl indium or triethyl indium. The active layer can be doped with N-type or P-type dopants, and can be doped with both or neither. Furthermore, the quantum layer can be without dopants, and the barrier layer can be with dopants; the quantum layer and the barrier layer can be both with dopants or both without dopants. The partial regions of the quantum well layer can be with delta dopants.

The steps of forming the P-type semiconductor electron barrier layer 407 on the active layer 406 are optional. The P-type semiconductor electron barrier layer 407 comprises a first III-V semiconductor layer and a second III-V semiconductor layer. These two III-V semiconductor layers with different energy band gaps are periodically and repeatedly disposed on the aforesaid active layers to act as an electron barrier with an energy band gap higher than the energy band gap of the active layer. Excessive electrons (e⁻) can prevented from overflowing to the active layer 406. The details and formation of the electron barrier layer of P-type conduction can be found by referring to TW application No. 097128065 filed by the present applicant.

Furthermore, the P-type semiconductor conductive layer 408 can be a layer of gallium nitride or aluminum gallium nitride acting as a cladding layer of the P-type conduction of the LED. The P-type conductive of gallium nitride or aluminum gallium nitride is formed in MOCVD equipment or MBE equipment. During the formation of the nitride layer, group II atoms are simultaneously doped. In this embodiment, the group II atoms are magnesium atoms. The precursor of magnesium is $Cp_2Mg$ suitable for the MOCVD equipment. Above the cladding layer, a contact layer (not shown) of P-type conduction can be formed thereon. The material of the contact layer of P-type conduction can be highly-doped gallium nitride or highly-doped aluminum gallium nitride to have a superior conductive effect with the P-type electrodes.

The above-described embodiments of the present invention are intended to be illustrative only. Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for blocking the dislocation propagation of a semiconductor, comprising:
    forming a plurality of recesses on a semiconductor layer where dislocation occurs;
    forming a blocking layer on each of the plurality of recesses;
performing epitaxial process on the semiconductor layer to laterally grow for redirecting dislocation defects;
    wherein the formation of the plurality of recesses on the semiconductor layer where dislocation occurs is done by etching, and the formation of the blocking layer in the recesses comprises the steps of:
    depositing a blocking layer on the semiconductor layer;
    coating a photoresist layer on the blocking layer to fill in the plurality of recesses; removing the photoresist layer outside the plurality of recesses;
    removing the blocking layer outside the plurality of recesses by etching and leaving a plurality of areas of the blocking layer existing in the recesses; and
    removing the photoresist layer remaining in the recesses.

2. The method for blocking the dislocation propagation of a semiconductor according to claim 1, wherein the material of the blocking layer is a dielectric material comprising magnesium nitride ($Mg_xN_y$), silicon nitride ($Si_xN_y$), silicon oxide ($Si_xO_y$), titanium oxide ($Ti_xO_y$), zirconium oxide ($Zr_xO_y$), hafnium oxide ($Hf_xO_y$), tantalum oxide ($Ta_xO_y$), silicon nitride (SiN), and silicon oxide (SiO).

3. The method for blocking the dislocation propagation of a semiconductor according to claim 1, wherein the photoresist layer is removed by a photolithography process.

4. The method for blocking the dislocation propagation of a semiconductor according to claim 1, the steps prior to the formation of the blocking layer in the recesses comprising:
    providing a substrate; and
    forming the semiconductor layer on the substrate.

5. The method for blocking the dislocation propagation of a semiconductor according to claim 4, further comprising a step of forming a buffer layer between the substrate and the semiconductor layer.

6. A method for blocking the dislocation propagation of a semiconductor, comprising:
    performing the steps of claim 1; and
    forming a compound semiconductor multilayer on the semiconductor layer by epitaxial process to form an LED.

7. The method for blocking the dislocation propagation of a semiconductor according to claim 6, wherein the formation of the blocking layers in the plurality of recesses comprises the steps of:
    depositing an original blocking layer on the semiconductor layer;
    coating a photoresist layer on the blocking layer to fill in the plurality of recesses;
    removing the photoresist layer outside the plurality of recesses;
    removing the blocking layer outside the plurality of recesses by etching and leaving a plurality of the blocking layers existing in the recesses; and
    removing the photoresist layer remaining in the recesses.

8. The method for blocking the dislocation propagation of a semiconductor according to claim 7, wherein a material of the blocking layers is a dielectric material comprising magnesium nitride ($Mg_xN_y$), silicon nitride ($Si_xN_y$), silicon oxide ($Si_xO_y$), titanium oxide ($Ti_xO_y$), zirconium oxide ($Zr_xO_y$), hafnium oxide ($Hf_xO_y$), tantalum oxide ($Ta_xO_y$), silicon nitride (SiN), and silicon oxide (SiO).

9. The method for blocking the dislocation propagation of a semiconductor according to claim 7, the steps prior to the formation of the blocking layer in the recesses comprising:
    providing a substrate; and
    forming the semiconductor layer on the substrate.

10. The method for blocking the dislocation propagation of a semiconductor according to claim 9, further comprising a step of forming a buffer layer between the substrate and the semiconductor layer.

11. The method for blocking the dislocation propagation of a semiconductor according to claim 9, wherein the material of the substrate is sapphire ($Al_2O_3$), silicon carbide (SiC), $AlLiO_2$, $LiGaO_2$, silicon (Si), gallium nitride (GaN), zinc oxide (ZnO), aluminum zinc oxide (AlZnO), gallium arsenide (GaAs), gallium phosphide (GaP), gallium antimonide (GaSb), indium phosphide (InP), indium arsenide (InAs), or zinc selenide (ZnSe).

12. The method for blocking the dislocation propagation of a semiconductor according to claim 10, further comprising a step of forming a P-type semiconductor electron barrier layer between the active layer and the P-type semiconductor conductive layer.

13. The method for blocking the dislocation propagation of a semiconductor according to claim 6, wherein the compound semiconductor multilayer comprises an N-type semiconductor conductive layer, an active layer, and a P-type semiconductor conductive layer, and the active layer is between the N-type semiconductor conductive layer and the P-type semiconductor conductive layer.

14. A method for blocking the dislocation propagation of a semiconductor, comprising:
    forming a semiconductor layer on a substrate by epitaxial process;
    forming a plurality of recesses on the semiconductor layer where dislocation occurs by etching process;
    forming a plurality of blocking layers on the plurality of recesses;
    performing epitaxial process on the semiconductor layer to laterally overgrow for redirecting dislocation defects;
    forming a compound semiconductor multilayer on the semiconductor layer by epitaxial process to form an LED;
    wherein the formation of the blocking layers in the plurality of recesses comprises the steps of:
    depositing an original blocking layer on the semiconductor layer;
    coating a photoresist layer on the blocking layer to fill in the plurality of recesses;
    removing the photoresist layer outside the plurality of recesses;
    removing the blocking layer outside the plurality of recesses by etching and leaving a plurality of the blocking layers existing in the recesses; and
    removing the photoresist layer remaining in the recesses.

15. The method for blocking the dislocation propagation of a semiconductor according to claim 14, wherein a material of the blocking layers is a dielectric material comprising magnesium nitride ($Mg_xN_y$), silicon nitride ($Si_xN_y$), silicon oxide ($Si_xO_y$), titanium oxide ($Ti_xO_y$), zirconium oxide ($Zr_xO_y$), hafnium oxide ($Hf_xO_y$), tantalum oxide ($Ta_xO_y$), silicon nitride (SiN), and silicon oxide (SiO).

16. The method for blocking the dislocation propagation of a semiconductor according to claim 14, wherein the photoresist layer is removed by a photolithography process.

17. The method for blocking the dislocation propagation of a semiconductor according to claim 14, wherein the material of the substrate is sapphire ($Al_2O_3$), silicon carbide (SiC), $AlLiO_2$, $LiGaO_2$, silicon (Si), gallium nitride (GaN), zinc oxide (ZnO), aluminum zinc oxide (AlZnO), gallium arsenide (GaAs), gallium phosphide (GaP), gallium antimonide (GaSb), indium phosphide (InP), indium arsenide (InAs), or zinc selenide (ZnSe).

18. The method for blocking the dislocation propagation of a semiconductor according to claim 14, wherein the steps of forming the compound semiconductor multilayer on the semiconductor layer by epitaxial process comprise:
    forming an N-type semiconductor conductive layer on the semiconductor layer;
    forming an active layer on the N-type semiconductor conductive layer; and
    forming a P-type semiconductor conductive layer on the active layer.

* * * * *